United States Patent
Tsujikawa et al.

(10) Patent No.: US 6,417,052 B1
(45) Date of Patent: Jul. 9, 2002

(54) FABRICATION PROCESS FOR SEMICONDUCTOR DEVICE

(75) Inventors: Shimpei Tsujikawa; Masahiro Ushiyama, both of Kokubunji; Toshiyuki Mine, Fussa, all of (JP)

(73) Assignee: Hitachi, Ltd., Tokyo (JP)

( * ) Notice: Subject to any disclaimer, the term of this patent is extended or adjusted under 35 U.S.C. 154(b) by 84 days.

(21) Appl. No.: 09/712,243

(22) Filed: Nov. 15, 2000

(30) Foreign Application Priority Data

Nov. 15, 1999 (JP) ........................................... 11-324295

(51) Int. Cl.$^7$ ............................................. H01L 21/336
(52) U.S. Cl. ........................ 438/287; 438/275; 438/591
(58) Field of Search ................................. 438/275, 287, 438/291, 591, FOR 202, FOR 490, FOR 489

(56) References Cited

U.S. PATENT DOCUMENTS

| | | | | |
|---|---|---|---|---|
| 5,927,992 A | * | 7/1999 | Hodges et al. | 438/297 |
| 6,033,943 A | * | 3/2000 | Gardner | 438/199 |
| 6,191,463 B1 | * | 2/2001 | Mitani et al. | 257/410 |
| 6,215,146 B1 | * | 4/2001 | Umeda et al. | 257/315 |

FOREIGN PATENT DOCUMENTS

| | | | | |
|---|---|---|---|---|
| JP | 63289820 A | * | 11/1988 | ......... H01L/21/306 |
| JP | 08130250 A | * | 5/1996 | ......... H01L/21/8234 |

* cited by examiner

*Primary Examiner*—George Fourson
*Assistant Examiner*—Thanh V Pham
(74) *Attorney, Agent, or Firm*—Antonelli, Terry, Stout & Kraus, LLP

(57) ABSTRACT

Provided is an improved fabrication process for a semiconductor device by means of which in fabrication of insulated gate semiconductor devices having gate insulating films including silicon oxide films of different thickness, no contamination from a photoresist is ensured in a silicon oxide film, generation of defects in the silicon oxide film to be otherwise caused by aqueous solution treatments is suppressed, and thereby variability of characteristics among the semiconductor devices is suppressed. A silicon oxide film of a gate insulating film is formed on a semiconductor surface, a silicon nitride film is formed thereon by means of a chemical vapor deposition method using monosilane and ammonia as a source gas prior to formation of a resist film, the resist film is selectively formed on the surface, part of the silicon nitride film not covered by the resist film and the silicon oxide film therebeneath are removed to expose a semiconductor surface, the exposed semiconductor surface is oxidized to form a second silicon oxide film having a thickness different from that of the previously described silicon oxide film, and gate electrodes are formed on the respective insulating films.

6 Claims, 12 Drawing Sheets

REGION 2 | REGION 1

FABRICATION PROCESS FOR SEMICONDUCTOR DEVICE

BACKGROUND OF THE INVENTION

The present invention relates to a fabrication process for a semiconductor device, especially an insulated gate semiconductor device and a semiconductor device fabricated using the fabrication process.

In a semiconductor integrated circuit device, especially a large scale integrated circuit device (LSI), fabricated on one semiconductor substrate, mixedly incorporated are insulated gate transistors with respective different performance requirements such as a combination of devices having respective requirements of a high speed operation and low power consumption, or a combination of devices with respective high and low threshold voltages, as insulated gate semiconductor devices constituting a memory mat section, an I/O circuit section and peripheral circuit sections thereof, for example. In order to realize such a semiconductor integrated circuit device, it is effective to adopt insulated gate semiconductor devices having respective different thickness of a gate insulating film.

For example, in JP-A-S61-194770, description is given of MOSFETs having respective gate oxide films different in thickness and a fabrication method therefor. A detailed disclosure is further given therein that a surface of a semiconductor substrate is oxidized to form a first gate oxide film, a photo-etching treatment using a photoresist film is applied thereon to selectively remove parts of the first gate oxide film and expose the surface of the semiconductor substrate corresponding to the parts, then the remaining photoresist film is removed, and thereafter the surface of the semiconductor substrate is again oxidized to form a second gate oxide film of a thickness different from that of the first gate oxide film.

Further, in JP-A-H8-130250, a fabrication method in which gate oxide films different in thickness are ensured so as not to be put into contact with a photoresist is disclosed in understanding that according to such a prior art method, a gate oxide film is contaminated by impurities in a photoresist during photo-etching, which in turn causes defects to occur. In the publication, a further detailed description is given of the fabrication method: A surface of a semiconductor wafer on which a gate oxide film is to be formed is covered with a silicon nitride film and in this condition, selective oxidation to form a field oxide film for device isolation is performed on the wafer. Thereafter, photo-etching is applied to remove the silicon nitride film from sites on each of which a thicker gate oxide film is to be formed and the thicker gate oxide film is grown in each site by thermal oxidation. After the growth of the thicker gate oxide film, all the silicon nitride film are removed by wet etching from the surface of the wafer. In this condition, by thermal oxidation, a thinner gate oxide film is grown while on the other hand, a thicker gate oxide film is further grown to increase a thickness.

A photoresist has carbon as a main constituting element and the carbon degrades insulating film characteristics when it is attached on or impregnated into the film.

As one of solutions for this problem, a process is conceived in which the attached or impregnated carbon on or in the insulating film is perfectly removed. While etching and cleaning of a silicon oxide film is required for removal of the carbon, requirements arise to immerse a silicon wafer into various kinds of aqueous solutions in a state that a gate oxide film is exposed by removal of a resist after photoetching, in steps such as first SC-1 cleaning, SC-2 cleaning, second SC-1 cleaning, then dilute hydrofluoric acid cleaning and the like, which will be described later. Further, it was found that in the steps, modification in characteristics of the gate oxide film occurs; therefore reliability of the film is reduced. To be concrete, an electric field at which a large area MOS capacitor causes its dielectric breakdown was measured on devices that had received the treatment of aqueous solutions and it was found that more among the devices tested were low in breakdown voltage of a gate oxide film. In addition to this, it was confirmed that especially, when an extremely thin gate oxide film in the range 2 to 6 nm is subjected to etching and cleaning using such aqueous solutions, defects in the gate oxide film are increased in number to affect device characteristics.

Accordingly, new techniques have been required that a gate oxide film is formed without exposing its surface to such aqueous solutions, or alternatively, a gate oxide film is achieved such that deterioration in characteristics thereof is a little even if exposed to such aqueous solutions. For example, while useful is cleaning with an aqueous solution such as of ammonia and hydrogen peroxide water, of sulfuric acid and hydrogen peroxide water or of ozone and sulfuric acid, but in the cases, it was confirmed that modification in characteristics occurs in a gate oxide film to some extent.

On the other hand, as another solution, a technique is conceived in which a photoresist film has no chance to be put into contact with a gate oxide film, but it was found that when in a condition that a thick gate oxide film is exposed, all the silicon nitride film is removed from a surface of the wafer by wet etching as described in the specification of the above described JP-A-H8-130250, especially in the paragraph [0028] thereof, the thick gate oxide film is exposed to an aqueous solution; therefore, defects arise in the gate oxide film as described above, which in turn, affects device characteristics adversely.

A demand has been very recently built up for a large scale semiconductor integrated circuit device (LSI) described above utilizing insulated gate FETs with, as a gate insulating film, a stacked structure including a thin film made of silicon oxide ($SiO_2$) and a thin film made of silicon nitride ($Si_3N_4$) aggressively. A further demand has been piled up for constitution of desired circuits or systems using a combination of FETs of this type and FETs with, as a gate insulating film, a thin film made of silicon oxide only in a mixed manner. While as a formation method for the silicon nitride film, a chemical vapor deposition method has been generally used in which dichlorosilane and ammonia are a source gas, this method has been found to be problematic when adopting in mass production of LSIs in that a deposition thickness of a silicon nitride film is largely affected by a condition of an underlying surface, which results in a wide spread of thickness variation of a gate insulating film and therefore, greater dispersion in characteristics such as a threshold voltage among many devices.

SUMMARY OF THE INVENTION

It is an object of the present invention to provide a fabrication method for an insulated gate FET in which a silicon nitride film is formed with a small thickness variation; therefore, threshold voltages of insulated gate FETs fall in a narrow range and the above described degradation in characteristics of an device is suppressed to be small.

It is another object of the present invention to provide a fabrication method for a semiconductor integrated circuit device using insulated gate FET's in which even when a wet treatment is applied in forming gate insulating films having respective different thickness on the same wafer, the gate insulating films maintain high reliability and furthermore a narrow range of thickness variation of devices can be ensured.

An aspect of the present invention is directed to a fabrication method for a semiconductor device including the steps of: forming a first silicon oxide film constituting a part of a gate insulating film on a semiconductor surface; forming a silicon nitride film by means of a chemical vapor deposition method using monosilane and ammonia as a source gas; forming a photoresist film selectively on the silicon nitride film thus formed; removing a part of the silicon nitride film not covered by the photoresist film and the first silicon oxide film beneath the part of the silicon nitride film to expose the semiconductor surface; oxidizing the exposed semiconductor surface after removal of the photoresist film to form a second silicon oxide film with a thickness different from that of the first silicon oxide; and forming gate electrodes on the insulating films.

According to such a fabrication method of the present invention, fabricated are an insulated gate semiconductor device having a gate insulating film comprising a silicon oxide film containing substantially no carbon and a silicon nitride film containing substantially no chlorine deposited on the silicon oxide film; and a semiconductor integrated circuit with the insulated gate semiconductor devices integrated on one substrate.

The foregoing and other objects, advantages, manner of operation and novel features of the present invention will be understood from the following detailed description when read in connection with the accompanying drawings.

DETAILED DESCRIPTION OF THE PREFERRED EMBODIMENTS

Prior to starting description of embodiments of the present invention, description will be given of a fabrication process for two MISFETs with different gate oxide film thickness when the present inventors fabricated the two MISFETs in a trial experiments without adopting the present invention, with reference to FIGS. 10(a) to 10(f), in order to facilitate comparison of a fabrication process other than the present invention with the present invention.

FIGS. 10(a) to 10(f) are sectional views of a main part of a semiconductor device in process steps of a fabrication method for a semiconductor device other than the present invention.

Figure 10A:
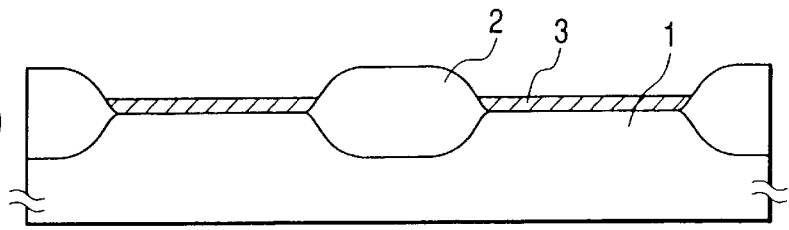
FIGS. 10(a) to 10(f) are sectional views of a main part of a semiconductor device in process steps of a fabrication process for a semiconductor device other than the present invention.
Figure 10B:
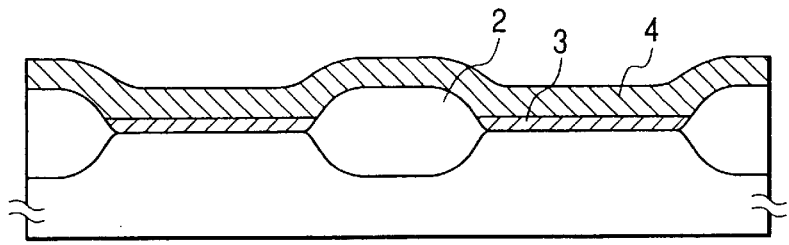
Figure 10C:
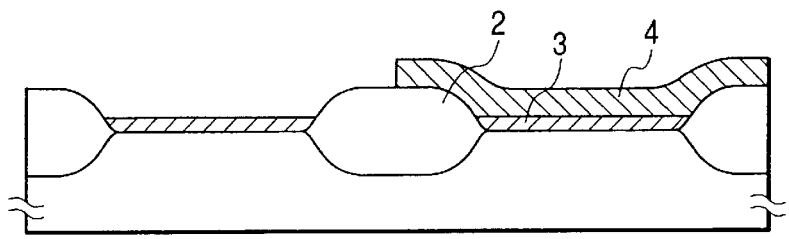
Figure 10D:
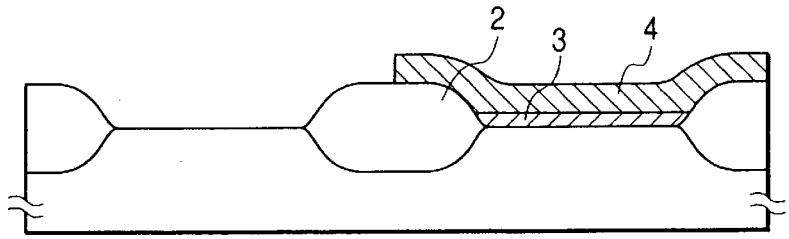

A device isolation layer (a field insulating film) 2 made of $SiO_2$ is formed on a surface of a silicon substrate (a wafer) 1 by means of a known selective thermal oxidation method and thereafter, a silicon oxide film 3 is formed on the silicon substrate 1 at 800° C. to a thickness of 7.7 nm (nano-meter) by means of pyrogenic oxidation in a condition that oxygen and hydrogen are simultaneously supplied at respective flow rates of 10 1/min and 0.5 1/min (FIG. 10(a)). Then, a photoresist film 4 is applied across the entire surface of the wafer (FIG. 10(b)) and thereafter, regular photoresist patterning is performed to remove part of the photoresist film 4 (FIG. 10(c)). A portion that is covered by the photoresist film 4 is called a region 1 while a portion that is not covered by the photoresist film 4 is called a region 2, for convenience of description at this time (the regions 1 and 2 are shown beneath FIG. 10(f) with the same terms). Following to the patterning, the silicon oxide film 3 in the region 2 is removed with a 0.5% hydrofluoric acid aqueous solution (FIG. 10(d)) and following this, the remained resist film 4 is removed by ashing (FIG. 10(e)). After the ashing, performed are cleanings with an aqueous solution containing ammonia and hydrogen peroxide water (hereinafter referred to as SC-1 cleaning) and with an aqueous solution containing hydrochloric acid and hydrogen peroxide water (hereinafter referred to as SC-2 cleaning) to eliminate contamination of the surface. Furthermore, second SC-1 cleaning and dilute hydrofluoric acid cleaning are performed and thereafter, pyrogenic oxidation at 800° C. is applied to form a gate insulating film 5 made of a silicon oxide film with a thickness of 4 nm and a gate insulating film 6 that is additionally grown to a thickness of 8 nm (FIG. 10(f)).

Figure 10E:
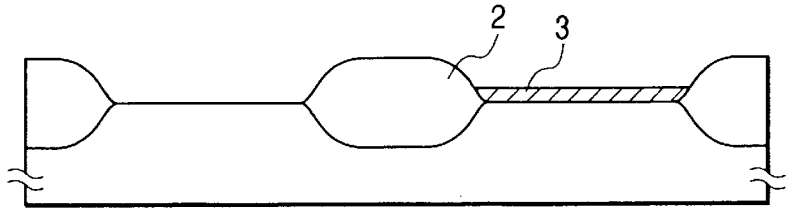

In the method other than the present invention, there is necessity to immerse a silicon wafer in various aqueous solutions in the FIG. 10(e) step of the SC-1 cleaning, SC-2 cleaning, second SC-1 cleaning and dilute hydrofluoric acid cleaning in a state of the silicon wafer whose gate oxide film 3 is exposed after the removal of the resist film 4 and since modification in characteristics of the gate oxide film 3 occurs in the cleaning steps, reliability of a gate insulating film 6 formed by pyrogenic oxidation has been low. Actually, when an electric field at which dielectric breakdown occurs was measured on a large area MOS capacitor fabricated with the gate insulating film 6, a breakdown voltage of the gate insulating film 6 was low in more cases of the measurement.

Embodiment 1

Now, description will be given of a first embodiment relating to a fabrication process of the present invention with reference to FIGS. 1(a) to 1(f).

FIGS. 1(a) to 1(f) are sectional views of a main part of a semiconductor device in process steps of the fabrication process according the present invention.

A thick device isolation layer (a field insulating film) 2 made of $SiO_2$ is formed on a surface of a silicon substrate (a wafer) 1 by means of a known selective thermal oxidation method. Thereafter, a silicon oxide film 3 is formed on the silicon substrate 1 at 800° C. to a thickness of 5.5 nm (nano-meter) by means of pyrogenic oxidation in a condition that oxygen and hydrogen are simultaneously supplied at respective flow rates of 10 1/min and 0.5 1/min, and then, a silicon nitride film 7 is formed on the surface to a thickness of 3 nm by means of a chemical vapor deposition method using monosilane ($SiH_4$) and ammonia ($NH_3$) as a source gas (FIG. 1(a)). At this point, for a comparison purpose, a specimen was also prepared by means of the chemical vapor deposition using dichlorosilane and ammonia as a source gas as detailed later.

After formation of the silicon nitride film 7, a photoresist film 4 is applied selectively on the silicon nitride film 7. Actually, first, the resist film 4 is applied across the entire surface of the wafer (FIG. 1(b)), and thereafter, regular photoresist patterning is performed to remove a part of the photoresist film 4 (FIG. 1(c)). A portion that is covered by the photoresist film 4 is called a region 1 while a portion that is not covered by the photoresist film 4 is called a region 2, for convenience of description at this time (the regions 1 and 2 are shown beneath FIG. 1(f) with the same terms). Following to the patterning, the silicon nitride film 7 and silicon oxide film 3 in the region 2 is removed with a 0.5% hydrofluoric acid aqueous solution (FIG. 1(d)) and following this, the remained resist film 4 is removed by ashing (FIG. 1(e)). After the ashing, SC-1 cleaning and SC-2 cleaning are performed to eliminate contaminants on the surface. Furthermore, second SC-1 cleaning and 0.1% hydrofluoric acid aqueous solution cleaning are performed on the substrate surface and thereafter, pyrogenic oxidation at 800° C. is applied to form a gate insulating film 5 made of a silicon oxide film with a thickness of 4 nm in the region 2. At this time, no change in thickness of the silicon oxide film 3 arises since oxidation does not progress in the region 1 covered by the silicon nitride film 7. By performing the above procedure, in the region 1, formed is a gate insulating film of a stacked structure including the silicon nitride film 7 of a thickness of 3 nm and the silicon oxide film 3 of a thickness of 5.5 nm while in the region 2, formed is the silicon oxide film 5 of a thickness of 4 nm as a gate insulating film; the gate insulating films are respectively used as gate insulating films of main parts of the respective devices (FIG. 1(f)). Thereafter, gate electrodes are formed on the respective insulating films to complete a semiconductor integrated circuit device constituted of MIS FETs as shown in FIG. 2.

Note that as a formation process for the silicon oxide film 3 and silicon oxide film 5, in addition to the above described pyrogenic oxidation, exemplified are dry oxidation to heat a wafer in an oxygen atmosphere, an oxy-nitriding treatment to heat a wafer in an atmosphere including nitric oxide or nitrous oxide, or a combination of the treatments. A silicon oxide film formed using the oxy-nitriding treatment contains nitrogen at the interface with the silicon substrate 1 and has a feature of a high hot carrier resistance, although mutual conductance decreases.

Description will be given of an example of an N-channel insulated gate transistor having gate insulating film different in thickness formed using the fabrication process of the present invention described in FIGS. 1(a) to 1(f) with reference to a sectional view shown in FIG. 2. Note that FIG. 2 is a view generally illustrating a structure of a semiconductor device, to which the present invention is applied.

Figure 1A:
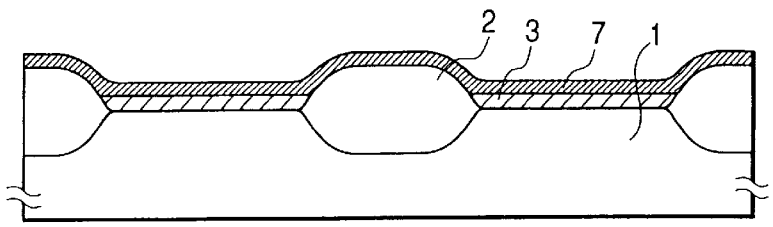
FIGS. 1(a) to 1(f) are sectional views of a main part of a semiconductor device in process steps of a fabrication process for the semiconductor device of the present invention.
Figure 1B:
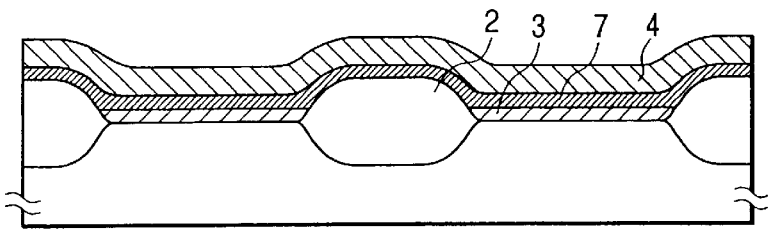
Figure 1C:
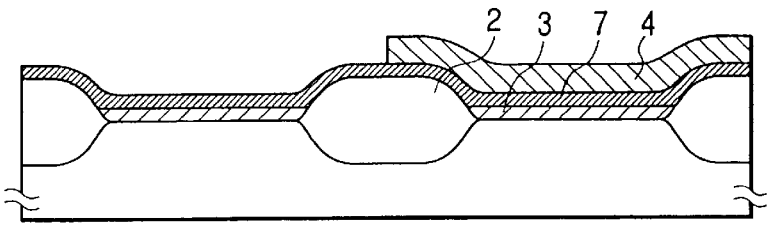
Figure 1D:
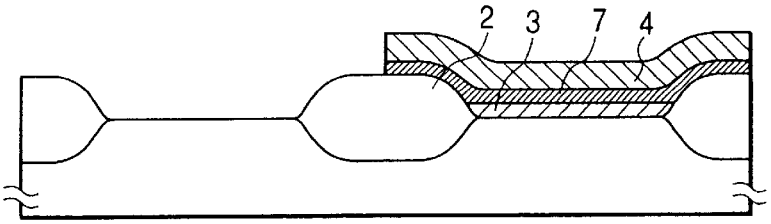
Figure 1E:
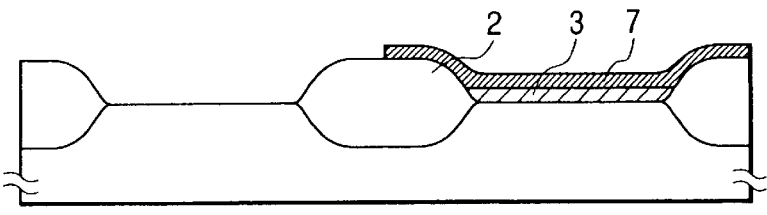
Figure 1F:
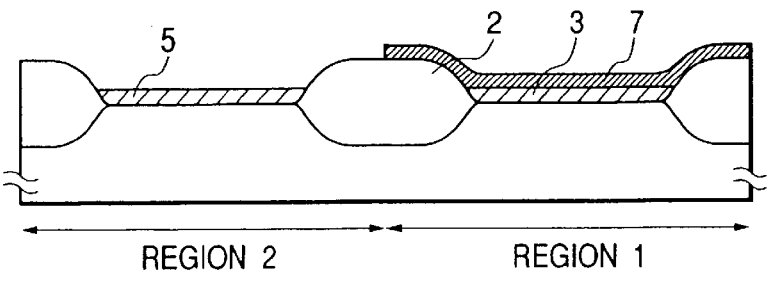
Figure 2:
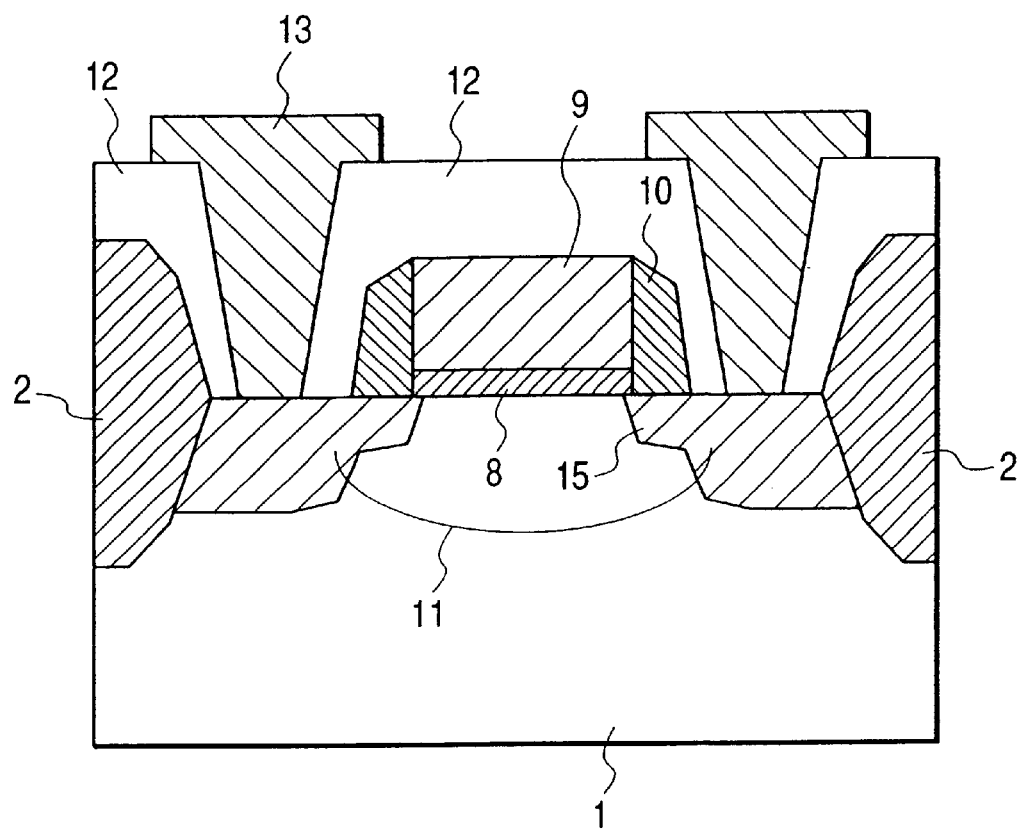
FIG. 2 is a sectional view of a semiconductor device obtained by means of the fabrication process for a semiconductor device of the present invention.

On the gate insulating films formed in the step of FIG. 1(f) using a P-type silicon substrate 1, deposited is an amorphous silicon film containing phosphorus at a concentration of $3 \times 10^{20}$ $cm^{-3}$ to a thickness of 200 nm by means of a known chemical vapor deposition method using monosilane and phosphine as a source gas and the amorphous silicon film is processed into gate electrodes 9 each with desired dimensions by means of photolithography and dry etching. Thereafter, arsenic ions are implanted with an acceleration voltage of 15 kV at a dose of $3 \times 10^{14}/cm^2$ to form a region 15 doped with an N-type impurity at a low concentration. Then, a silicon oxide film is formed by a chemical vapor deposition method using monosilane and nitrous oxide to a thickness of 100 nm and the silicon oxide film is subjected to anisotropic etching to form sidewalls 10 made of silicon oxide on side surfaces of the gate electrode. Phosphorus ion is implanted with an acceleration voltage of 30 kV at a dose of $2 \times 10^{15}/cm^2$ to form a region 11 doped with an N-type impurity at a high concentration. After the ion implantation, a heat treatment is applied at 950° C. for 30 sec to activate arsenic ions and phosphorus ions implanted in the regions 11 and 15. After the heat treatment, a silicon oxide film is deposited to 50 nm by means of a chemical vapor deposition method using monosilane and nitrous oxide, and a silicon oxide film of a boron concentration of 2% and a phosphorus concentration of 20% is further formed, likewise, by means of the chemical vapor deposition method using monosilane, diborane, phosphine, and oxygen, followed by heat treatment at 850° C. to planarize the surface of the silicon wafer to form an interlayer insulating film 12. Contact holes are formed in the interlayer insulating film 12 by photolithography and dry etching, tungsten is deposited by chemical vapor deposition and sputtering such that the contact holes are filled therewith and tungsten deposition is processed by photolithography and dry etching to form electrode interconnects 13. After the above described procedure, completed is an N-channel insulated gate field effect transistor (MISFET) having the structure shown in FIG. 2.

Figure 3:
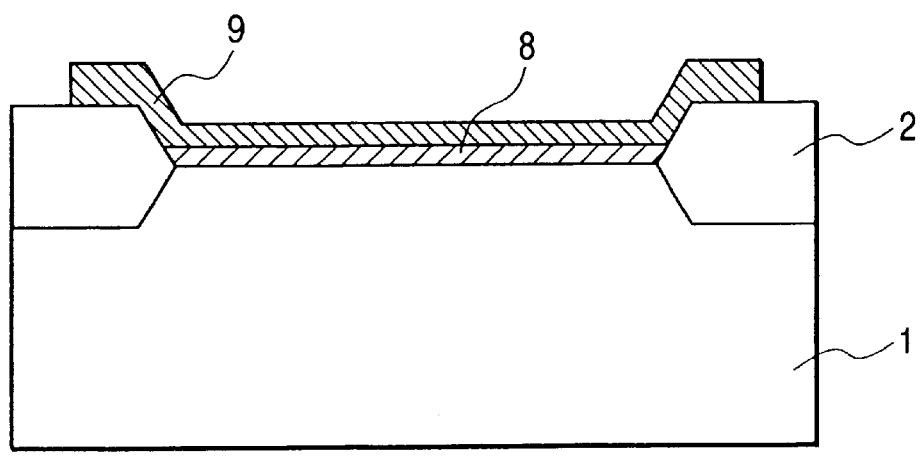
FIG. 3 is a sectional view of a MIS capacitor for explaining an effect of the present invention.
Figure 10F:
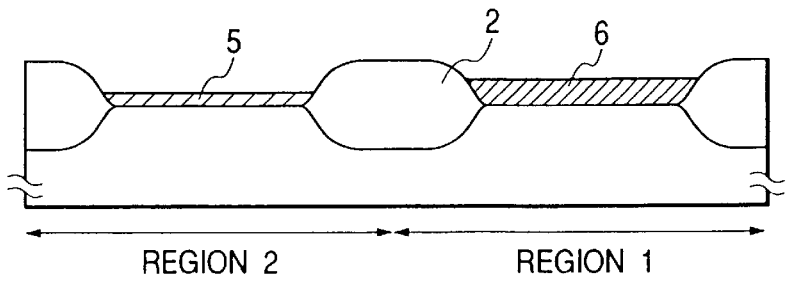
Figure 11A:
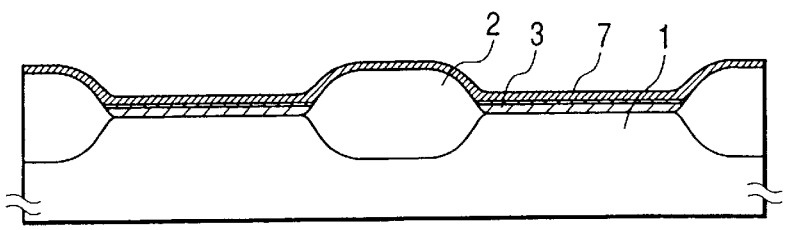
FIGS. 11(a) to 11(f) are sectional views of a main part of a semiconductor device in process steps of further another example of the fabrication process for the semiconductor device of the present invention.
Figure 11B:
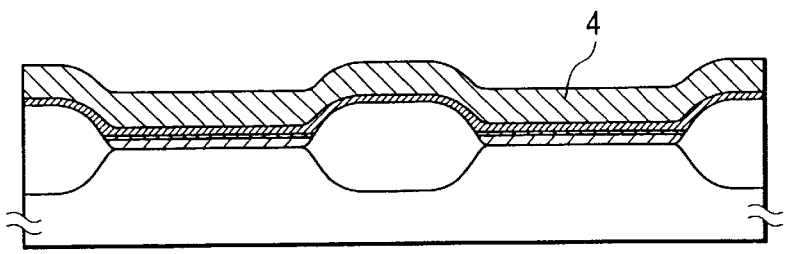
Figure 11C:
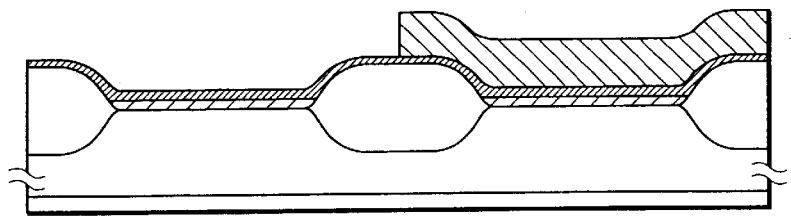
Figure 11D:
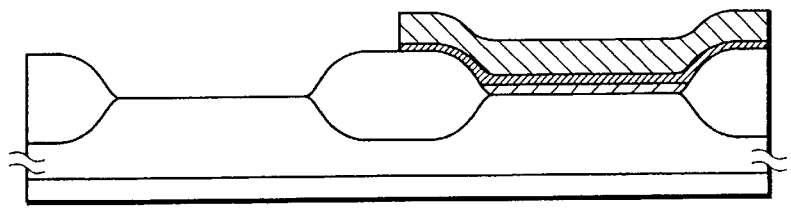
Figure 11E:
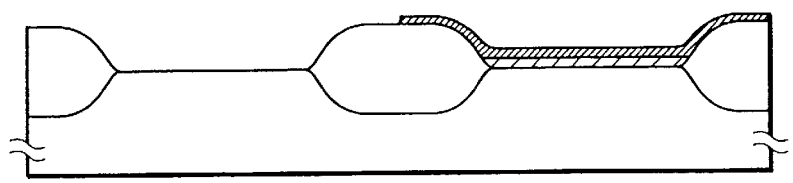
Figure 11F:
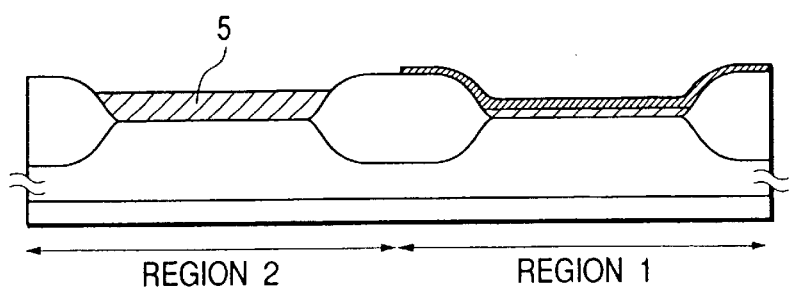
Figure 12A:
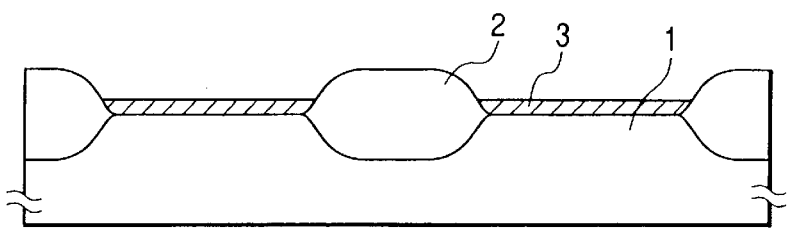
FIGS. 12(a) to 12(g) are sectional views of a main part of a semiconductor device in process steps of a fabrication process for a semiconductor device other than the present invention.
Figure 12B:
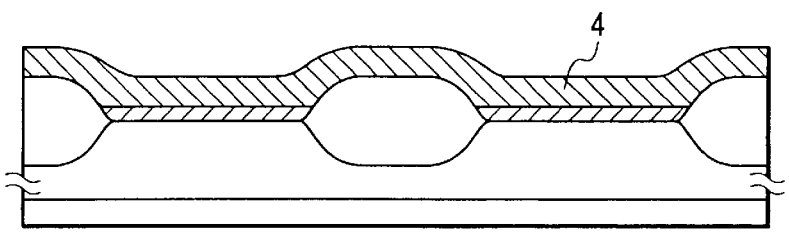
Figure 12C:
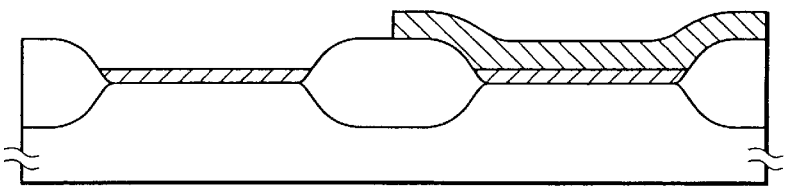
Figure 12D:
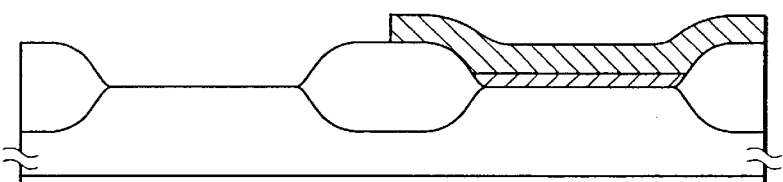
Figure 12E:
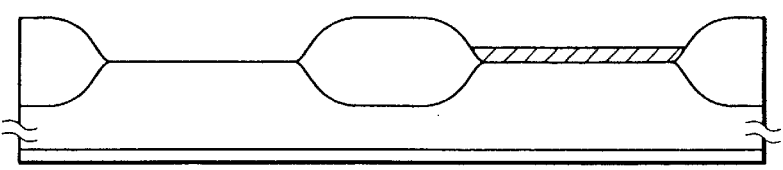
Figure 12F:
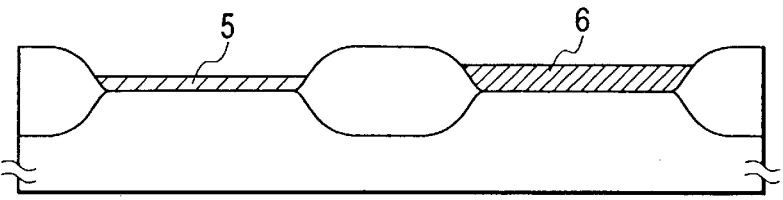
Figure 12G:
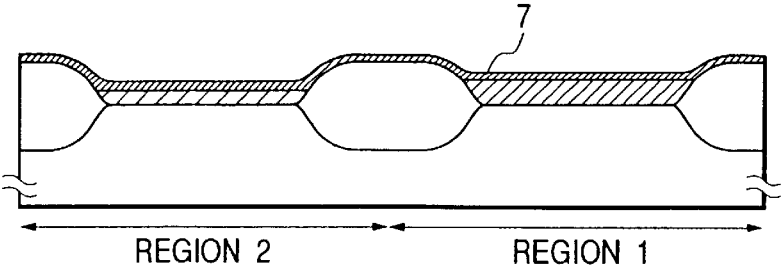

Next, in order to compare reliability of gate insulating films with two levels of thickness of a process relating to the present invention with reliability of the gate insulating films with two levels of thickness of a process other than the present invention, MIS capacitors shown in FIG. 3 were fabricated and evaluated. Results will be described: Note that in order that comparison can be effected with the almost same thickness as those corresponding of the first example of the present invention described above, a thickness of a silicon oxide film 3 in FIG. 10(a) is changed to 6.5 nm and thickness of the silicon oxide film 5 and the silicon oxide film 6 in FIG. 10(f) are changed to 4 nm and 7 nm, respectively.

FIG. 3 is a sectional view of a MIS capacitor with an upper surface area of a gate insulating film of 1 $cm^2$, which is fabricated in a procedure that a P-type silicon substrate is used as the silicon substrate 1; after a gate insulating film 8 (similar to FIG. 2) is formed, an amorphous silicon film containing phosphorus at an concentration of $3 \times 10^{20}$ cm$^{-3}$ is deposited to a thickness of 200 nm by means of a chemical vapor deposition method using monosilane and phosphine as a source gas; and then, the amorphous silicon film is processed into desired dimensions by photolithography and dry etching to form an electrode 9.

Figure 4A:
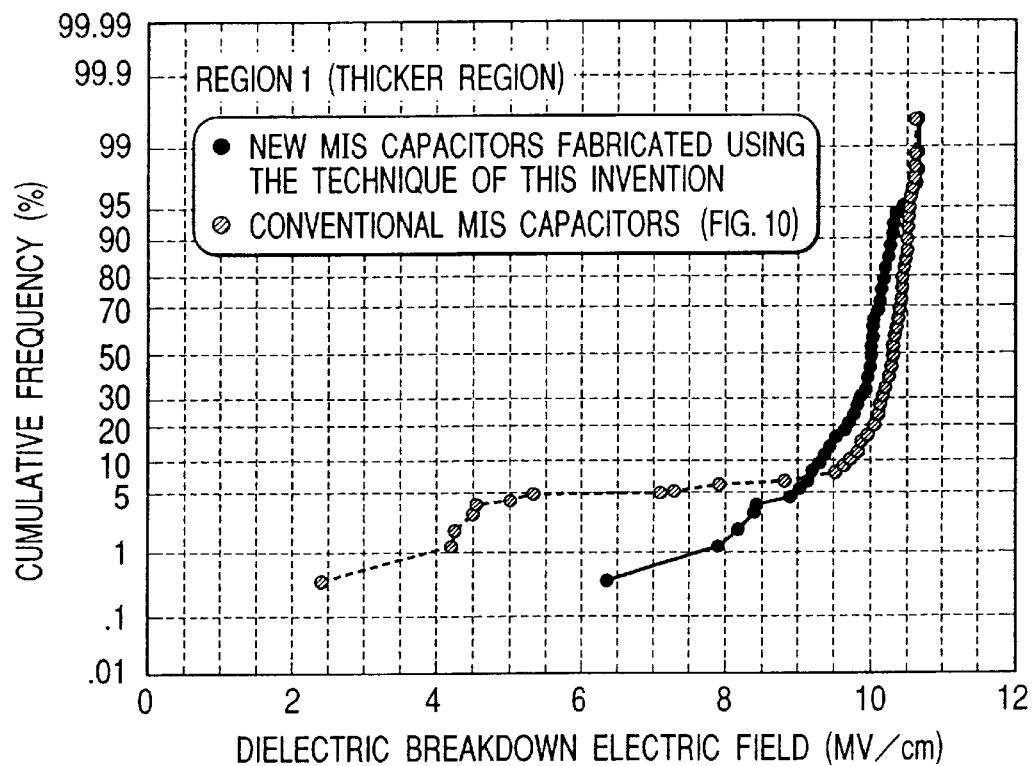
FIGS. 4(a) and 4(b) are graphs of characteristics for explaining the effect of the present invention.
Figure 4B:
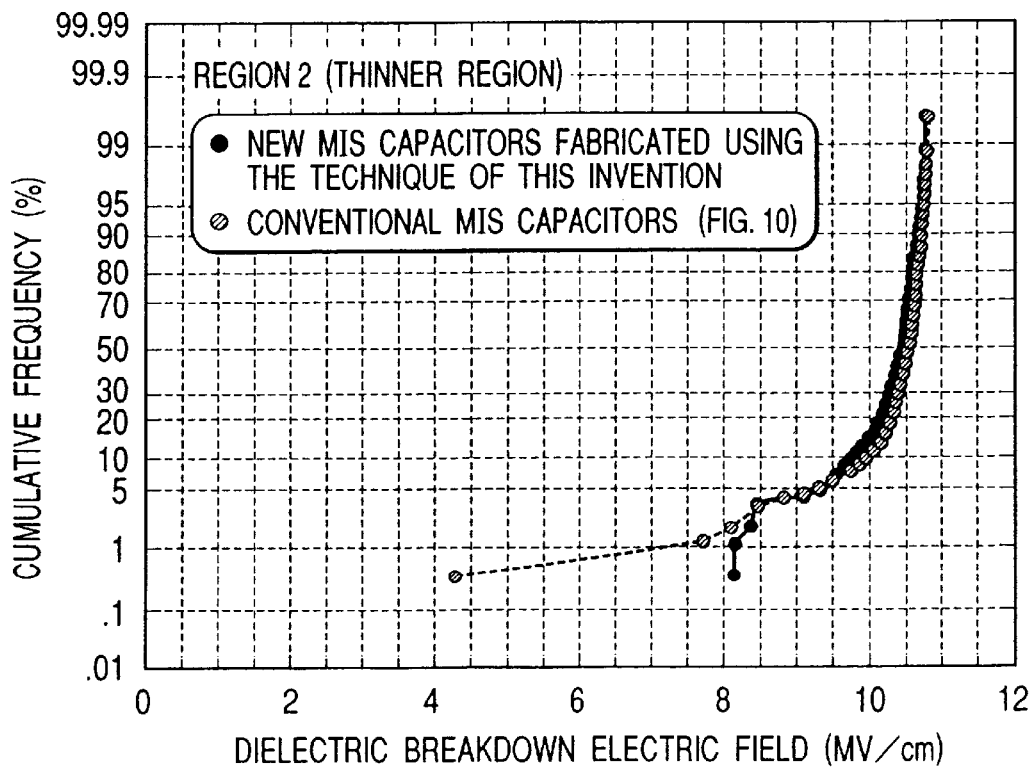

FIGS. 4(a) and 4(b) are graphs showing results of measurements on breakdown voltages of the MIS capacitors in the form of cumulative frequency distributions (%) plotted using the coordinate. FIG. 4(a) is results obtained when compared between the gate insulating films larger in thickness of the regions 1 of FIGS. 1(a) to 1(f) and FIGS. 10(a) to 10(f), respectively, and specimens prepared by means of a process of the present invention have smaller variations of breakdown voltage characteristic than by means of a process other than the present invention. By adopting a process of the present invention, it is estimated that a gate insulating film larger in thickness formed in the region 1 is achieved as a film more homogeneous and purer in quality and especially a defect density in a silicon oxide film of the lower part is suppressed to a lower value than by means of a process other than the present invention.

This is considered because in a process of the present invention, as described above, the gate oxide film 3 has neither of chances to be put into contact with a photoresist containing carbon and in addition to this, exposed direct to aqueous solutions producing defects. Further, carbon. contents in the silicon oxide film 3 of the region 1 in the last step shown in FIG. 1(f) and in the silicon oxide film in a device structure completed as shown in FIG. 2 using the silicon oxide film 3 were measured using a state-of-the art secondary ion mass spectrometer (SIMS) and no carbon is detected with the detection lower limit of $1 \times 10^{17}$/cm$^3$, e.g., $2 \times 10^{-4}$ atomic %; therefore, it can be said that the silicon oxide film 3 beneath the silicon nitride film 7 in a semiconductor device fabricated by means of the present invention contains substantially no carbon and is homogeneous and pure in quality as one feature.

As shown in FIG. 4(b), there were not observed a difference as conspicuous as it would be expected, in variability in breakdown voltage between specimens of the gate insulating film 5 smaller in thickness formed in the region 2 according to the process of the present invention and those according to the process other than the present invention, although the specimens according to the process of the present invention are likely to have smaller variability in breakdown voltage than those according to the process other than the present invention.

Figure 6:
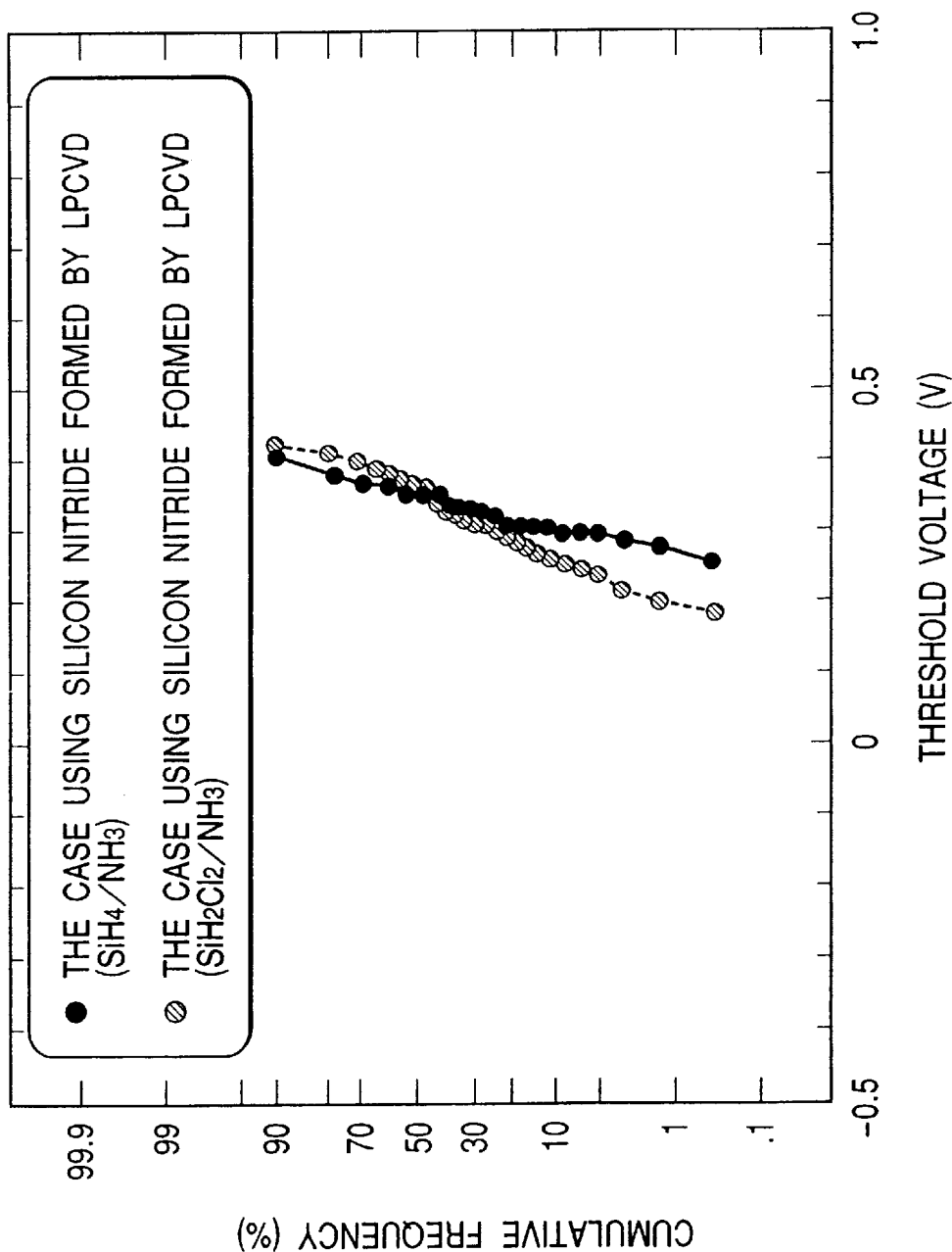
FIG. 6 is a graph of characteristics for explaining the effect of the present invention.

Further, as described in the FIG. 1(a) step, when comparison was conducted between distributions of threshold voltages of respective N-channel MIS transistors (the structure is shown in FIG. 2), both according to the present invention, in one of which the silicon nitride film 7 was formed by means of a chemical deposition method using monosilane (SiH$_4$) and ammonia as a source gas, while in the other of which the silicon nitride film 7 was formed by means of a chemical deposition method using dichlorosilane (SiH$_2$Cl$_2$) and ammonia as a source gas, then it was found that in cumulative frequency distribution characteristics of threshold voltages of both transistors of FIG. 6, the transistors of the present invention using monosilane and ammonia as a source gas had steeper inclination than those using dichlorosilane and ammonia as a source gas; therefore the former has a smaller variability of the distribution.

Figure 5A:
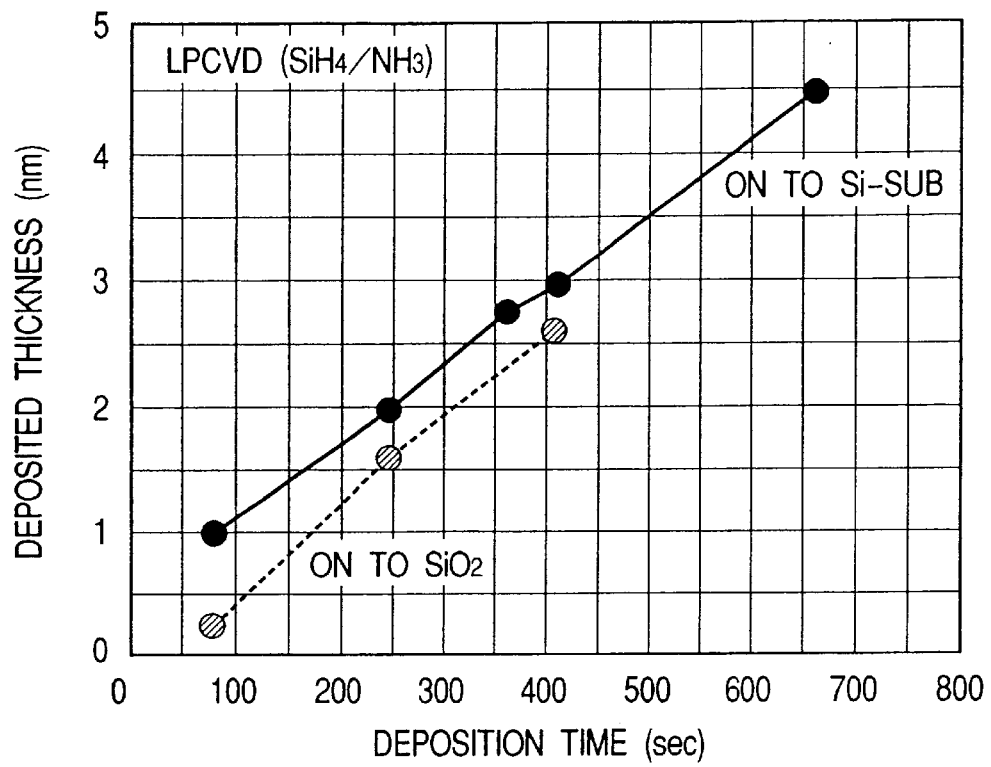
FIGS. 5(a) and 5(b) are graphs of characteristics for explaining the effect of the present invention.
Figure 5B:
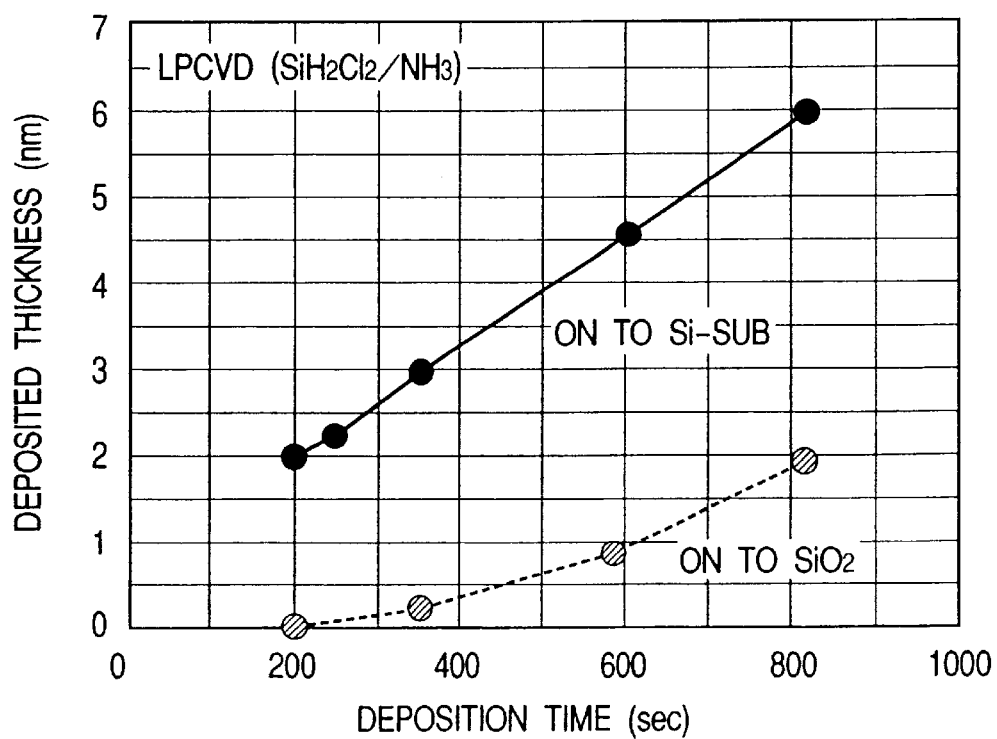

This is considered because thickness variability of the silicon nitride film 7 deposited by means of a chemical vapor deposition method is suppressed to be smaller and it was made clear that formation of the silicon nitride film 7 is required to be formed by means of a chemical vapor deposition method using monosilane and ammonia as a source gas. FIGS. 5(a) and 5(b) are measurement results showing relations between a deposition time and a deposited film thickness when silicon nitride films are deposited on a silicon substrate and an SiO$_2$ substrate using the respective two kinds of gas, and as seen from the figure, the deposited film thickness is less dependent on a kind of substrate material or properties thereof in the case where monosilane is adopted than in the case where dichlorosilane is adopted, which, it is estimated, supports the phenomenon that variability of deposited film thickness is smaller in the former case than in the latter case.

Note that since dichlorosilane includes relatively high activity chlorine, it is estimated that a gas of a compound including silicon and hydrogen but substantially without chlorine is preferably adopted, wherein there is no specific limitation to monosilane as a silicon source. Further, substantially no chlorine is contained in a silicon nitride film formed by means of a present invention process (to be exact, no chlorine is detected even by a state-of-the art secondary ion mass spectrometer (SIMS) having the detection lower limit of $1 \times 10^{17}$/cm$^2$, e.g., $2 \times 10^{-4}$ atomic %; therefore it can be said that a chlorine content is less than the limit value) while, in contrast to this, chlorine was clearly detected in a silicon nitride film formed by means of a chemical vapor deposition method using dichlorosilane and ammonia as a source gas at a concentration of $2 \times 10^{17}$/cm$^3$ or more.

From the description above, according to a process of the present invention, it can be taken up as a feature that in the region 1, a gate insulating film is of a silicon oxide film including substantially no carbon and a silicon nitride film including substantially no chlorine.

Embodiment 2

Next, description will be given of a second embodiment relating to a fabrication process of the present invention using sectional views of a main part of a semiconductor device in fabrication process steps shown in FIGS. 7(a) to 7(g).

Figure 7A:
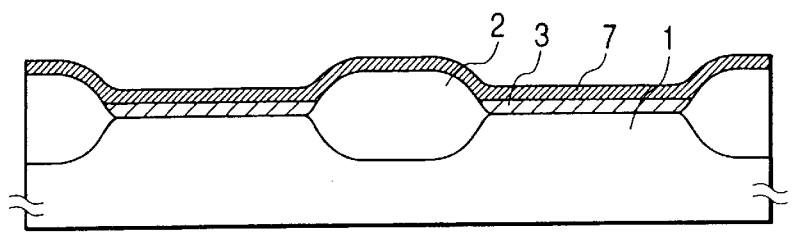
FIGS. 7(a) to 7(g) are sectional views of a main part of a semiconductor device in process steps of another example of the fabrication process for the semiconductor device of the present invention.
Figure 7B:
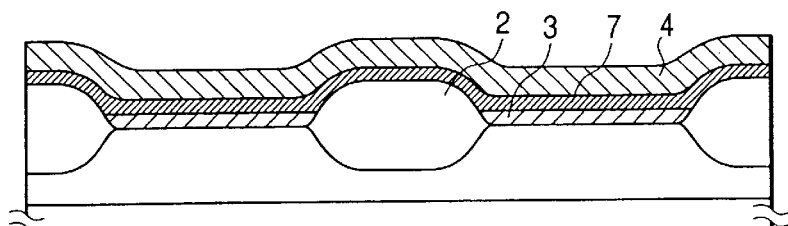
Figure 7C:
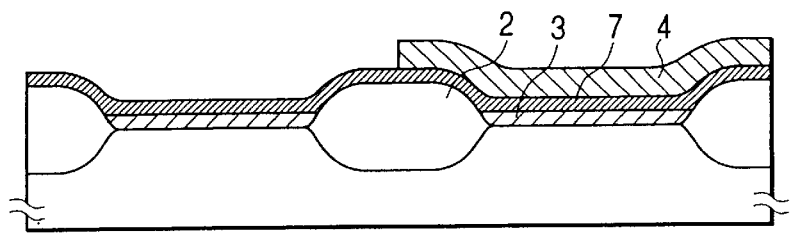
Figure 7D:
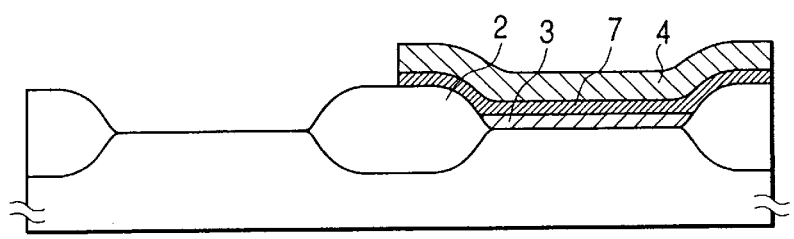
Figure 7E:
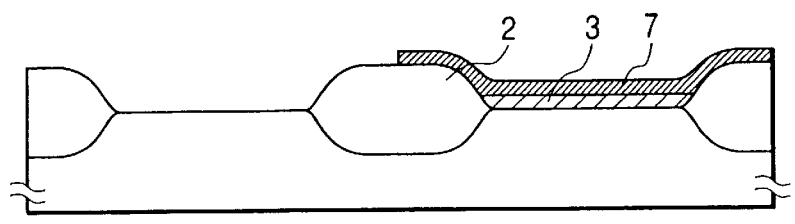
Figure 7F:
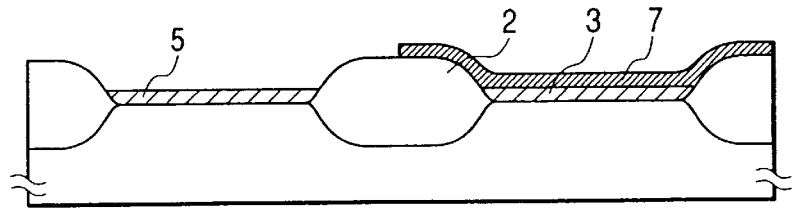
Figure 7G:
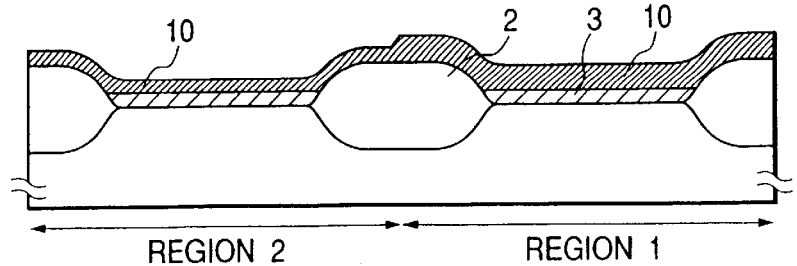

A thick device isolation layer (a field insulating film) 2 is formed on a surface of a silicon substrate (a wafer) 1 by means of a known selective thermal oxidation method, thereafter, a silicon oxide film 3 is formed on the silicon substrate 1 at 800° C. to a thickness of 5.5 nm by means of pyrogenic oxidation in a condition that oxygen and hydrogen are simultaneously supplied at respective flow rates of 10 1/min and 0.5 1/min, and then, a silicon nitride film 7 is formed on the surface to a thickness of 2 nm by means of a chemical vapor deposition method using monosilane and ammonia as a source gas (FIG. 7(a)). After formation of the silicon nitride film 7, a photoresist film 4 is applied across the entire wafer surface (FIG. 7(b)), and thereafter, regular photoresist patterning is performed to remove part of the photoresist film 4 (FIG. 7(c)). A portion that is covered by the photoresist film 4 is called a region 1 while a portion that is not covered by the photoresist film 4 is called a region 2, for convenience of description at this time. Following to the patterning, the silicon oxide film 3 and silicon nitride film 7 in the region 2 is removed with a 0.5% hydrofluoric acid aqueous solution (FIG. 7(d)) and following this, the remained resist film 4 is removed by ashing (FIG. 7(e)) After the ashing, SC-1 cleaning and SC-2 cleaning are performed to eliminate contaminants on the surfaces. Furthermore, second SC-1 cleaning and 0.1% hydrofluoric acid aqueous solution cleaning are performed on the substrate surface and thereafter, pyrogenic oxidation at 800° C. is applied to form a silicon oxide film 5 with a thickness of 3 nm in the region 2 (FIG. 7(f)).

In this situation, no change in a thickness of the film arises in the region 1 since oxidation does not progress in the region 1 covered by the silicon nitride film 7. After the pyrogenic oxidation, a silicon nitride film 10 is deposited to a thickness of 2 nm thereon by a chemical vapor deposition method using monosilane and ammonia as a source gas. In such a way, in the region 1, formed is a gate insulating film of a stacked structure including the silicon nitride film of a thickness of 3 nm and the silicon oxide film of a thickness of 5.5 nm while in the region 2, formed is a gate insulating film of a stacked structure including a silicon nitride film of a thickness of 2 nm and a silicon oxide film of a thickness of 3 nm (FIG. 7(g)). Thereafter, gate electrodes are formed on the respective insulating films to complete a semiconductor integrated circuit device constituted of MIS FETs as described in FIG. 2.

In the example of FIG. 7, the silicon nitride films are formed beneath the respective gate electrodes not only in the region 1 but also in the region 2 and the silicon oxide film 5 in the region 2 is protected similar to the silicon oxide film 3 of the region 1. Further, in a P channel MOS transistor using $p^+$ polysilicon doped with boron as a gate electrode, the above described silicon nitride suppresses out-diffusion of boron in the gate electrode to the silicon substrate; therefore, an advantage can be enjoyed in that variations of a threshold voltage are suppressed.

Figure 8A:
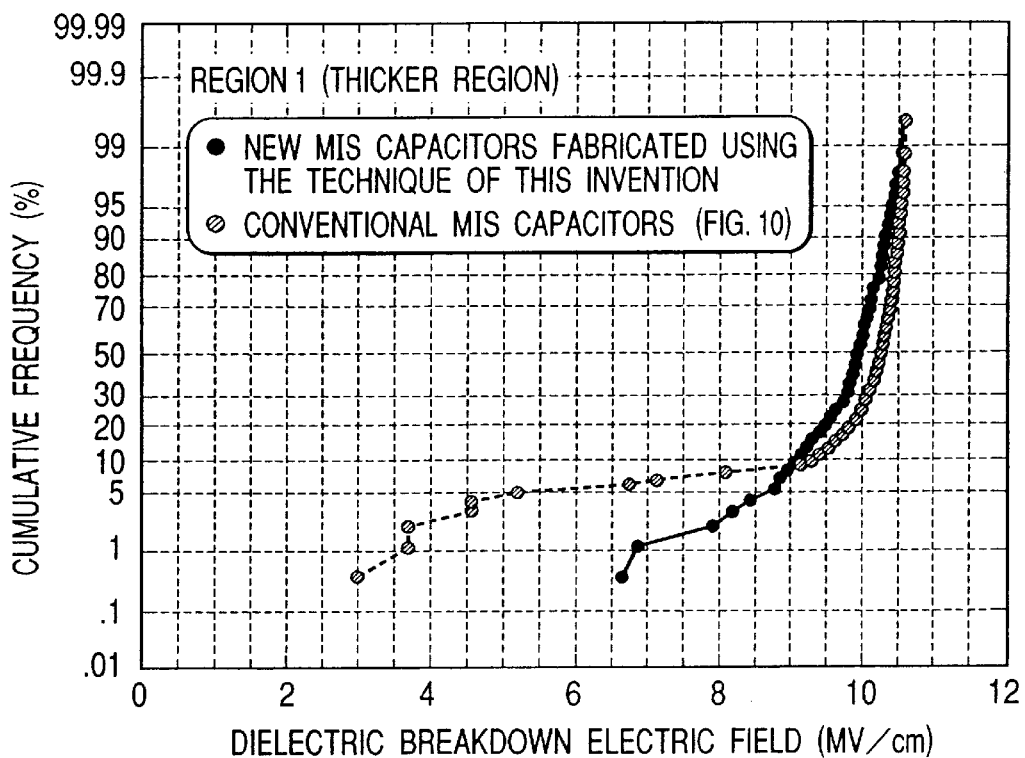
FIGS. 8(a) and 8(b) are graphs of characteristics for explaining the effect of the present invention.
Figure 8B:
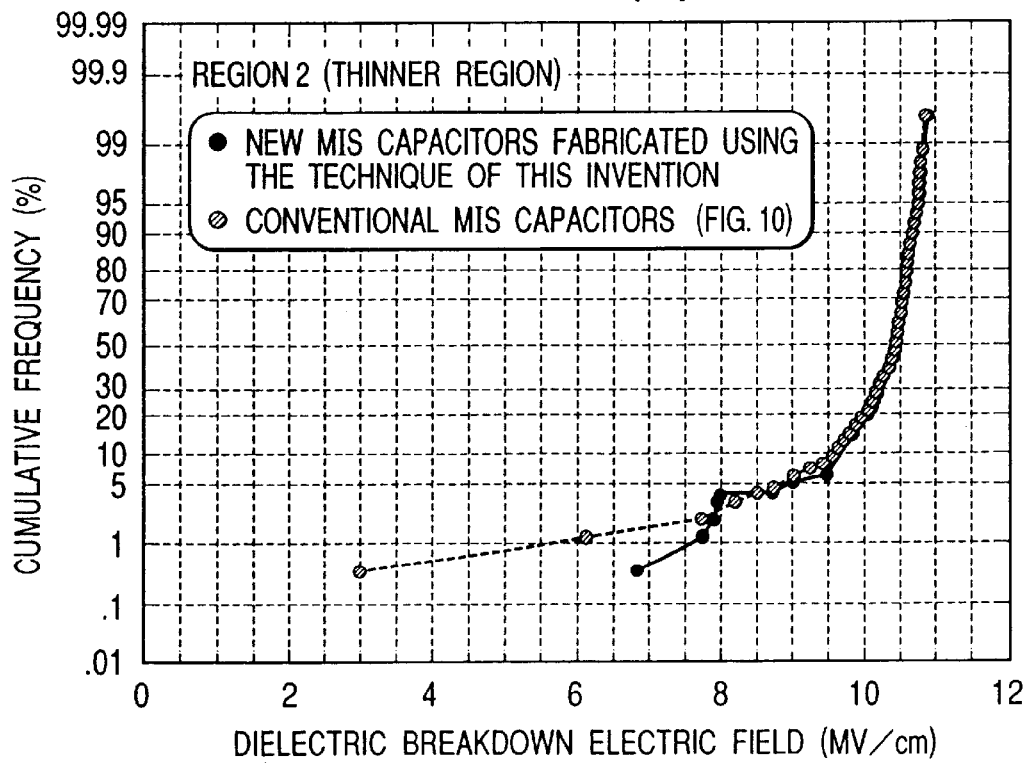

Next, in order to compare characteristics of a gate insulating film formed by means of a process of the present invention of FIGS. 7(a) to 7(g), with the gate insulating film formed by means of a process other than a method of the present invention described above with reference to FIGS. 10(a) to 10(f), measurements were performed on MIS capacitors shown in FIG. 3 similar to the above described and results thereof are described using FIGS. 8(a) and 8(b). Specimens according to the process other than the method of the present invention were fabricated under the same conditions as those detailed previously using FIGS. 10(a) to 10(f).

FIGS. 8(a) and 8(b) are graphs in which breakdown electric fields measured on gate insulating films formed in the regions 1 and 2, respectively, are expressed with curves plotted as cumulative frequency distributions (%). A gate insulating film larger in thickness formed by means of a technique of the present invention has a smaller variability of breakdown voltage characteristic than by means of a process other than the technique of the present invention (FIG. 8(a)). It is understood that by using a technique of the present invention, a defect density in the gate insulating film larger in thickness formed in the region 1 is suppressed. In the region 2, the gate insulating film smaller in thickness formed by means of a technique of the present invention had a breakdown voltage characteristic almost equal to the characteristic of the gate insulating film smaller in thickness formed by means of a technique other than the technique of the present invention (FIG. 8(b)).

Embodiment 3

Next, description will be given of a third embodiment using sectional views of a main part of a semiconductor device in process steps shown again in FIGS. 7(a) to 7(g).

A device isolation layer 2 is formed on a surface of a silicon substrate (a wafer) 1 by means of a known selective thermal oxidation method, thereafter, a silicon oxide film 3 is formed on the silicon substrate 1 at 800° C. to a thickness of 3.5 nm by means of pyrogenic oxidation in a condition that oxygen and hydrogen are simultaneously supplied at respective flow rates of 10 1/min and 0.5 1/min, and then, a silicon nitride film 7 is formed on the surface to a thickness of 2 nm by means of a chemical vapor deposition method using monosilane and ammonia as a source gas (FIG. 7(a)). After formation of the silicon nitride film 7, a photoresist film 4 is applied across the entire wafer surface (FIG. 7(b)), and thereafter, regular photoresist patterning is performed to remove part of the photoresist film 4 (FIG. 7(c)). A portion that is covered by the photoresist film 4 is called a region 1 while a portion that is not covered by the photoresist film 4 is called a region 2, for convenience of description at this time. Following to the patterning, the silicon oxide film 3 and silicon nitride film 7 in the region 2 is removed with a 0.5% hydrofluoric acid aqueous solution (FIG. 7(d)) and following this, the resist film 4 is removed by ashing (FIG. 7(e)). After the ashing, SC-1 cleaning and SC-2 cleaning are performed to eliminate contaminants on the surfaces. Furthermore, second SC-1 cleaning and 0.1% hydrofluoric acid aqueous solution cleaning are performed on the substrate surface and the substrate 1 is immersed in a 10% hydrogen peroxide water for 30 min to form a silicon oxide film 5 of a thickness of 1 nm in the region 2 (FIG. 7(f)). In this situation, no change in a thickness of the film in the region 1 arises since oxidation does not progress in the region 1 covered by the silicon nitride film 7. After the immersion, a silicon nitride film is deposited to a thickness of 2 nm thereon by a chemical vapor deposition method using monosilane and ammonia as a source gas. In such a way, in the region 1, formed is a gate insulating film of a stacked structure including the silicon nitride film of a thickness of 3 nm and the silicon oxide film of a thickness of 3.5 nm while in the region 2, formed is a gate insulating film of a stacked structure including a silicon nitride film of a thickness of 2 nm and a silicon oxide film of a thickness of 1 nm (FIG. 7(g)). The third example is largely different from the second example described above in that when the silicon oxide film 5 is formed in the region 2, it is performed by means of immersion in a hydrogen peroxide water but not by means of a heat treatment in an oxidizing atmosphere and a silicon oxide film of an extremely thin thickness less than 1 nm can be formed with good controllability.

Figure 9A:
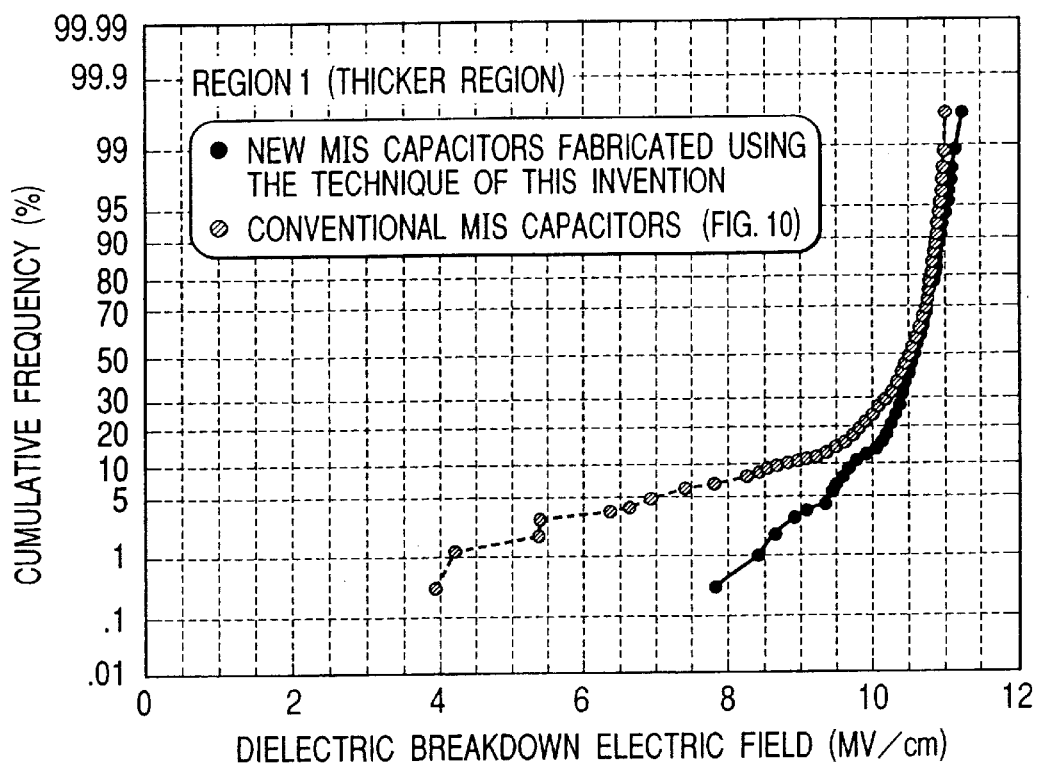
FIGS. 9(a) and 9(b) are graphs of characteristics for explaining the effect of the present invention.
Figure 9B:
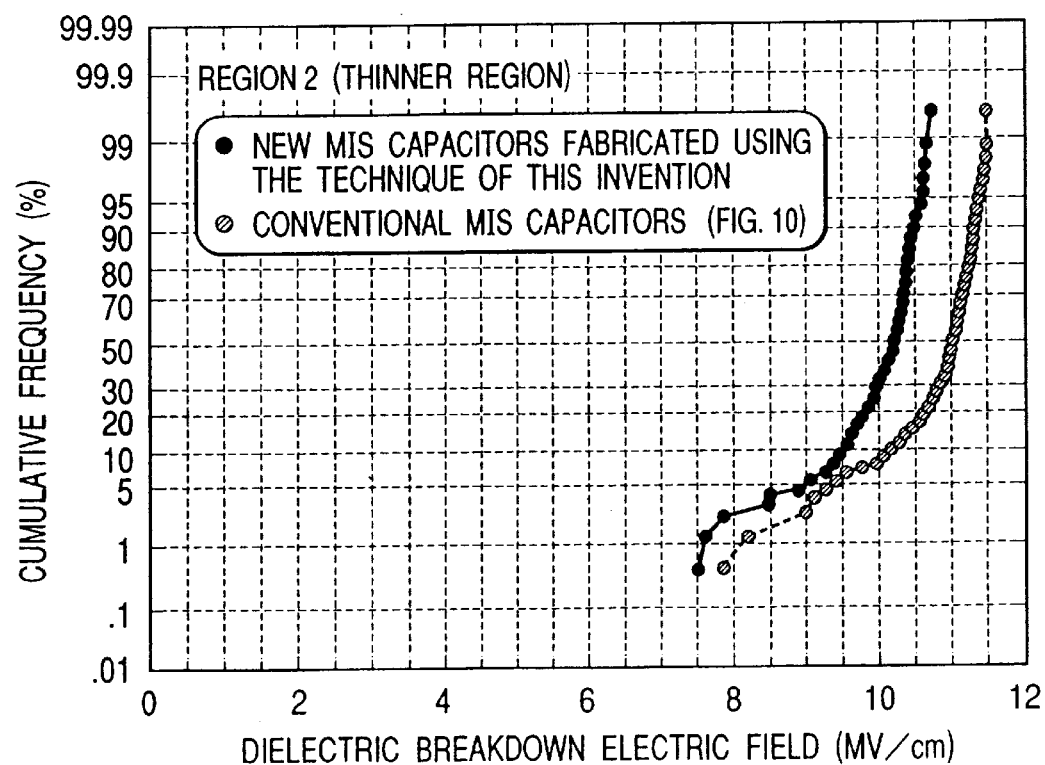

In order to compare characteristics of a gate insulating film formed by means of the example of the present invention with one formed by means of a process other than a process of present invention, MIS capacitors were prepared in a trial, measurements of a breakdown electric field strength were performed on the specimens, similar to FIGS. 8(a) and 8(b) and results are shown in FIGS. 9(a) and 9(b). In order that thickness of the respective gate insulating films compared with each other are equal, the specimens formed by means of the process other than the process of the present invention were prepared such that a thickness of the silicon oxide film 3 in FIG. 10(a) was set to a thickness of 5 nm and a thickness of the silicon oxide film 5 in FIG. 10(f) was adjusted to be 2 nm applying pyrogenic oxidation at as low as 700° C. and furthermore, conditions were changed so that a thickness of the silicon oxide film 6 was about 5 nm.

Fewer specimens of the gate insulating film larger in thickness formed in the region 1 formed by means of the process of the present invention had failed to reach an acceptable level of breakdown voltage than those formed by means of the process other than the process of the present invention had (FIG. 9(a)). This is considered because a defect density of the gate insulating film larger in thickness formed in the region 1 is suppressed in the case of the process of the present invention. Although the insulating gate film smaller in thickness in the region 2 formed by means of the process of the present invention was generally lower in breakdown voltage than in the case of the process other than the process of the present invention (FIG. 9(b)), it is understood that since a fraction defective of a breakdown voltage (corresponding to a product yield) when semiconductor integrated circuit devices are mass produced is still determined by characteristics of the gate insulating film larger in thickness formed in the region 1, the feature of smaller variability of characteristics of the gate insulating film larger in thickness formed in the region 1 in application of the present invention is effective.

According to the fabrication process, mass production of semiconductor integrated circuits is realized with high yield since no contamination from a photoresist occurs in a silicon oxide film constituting a gate insulating film, and/or increase in defect density in the silicon oxide film to be otherwise caused by aqueous solution treatments is suppressed, and variability of characteristics among many of devices is suppressed.

Embodiment 4

Next, description will be given of a fourth embodiment relating to a fabrication process of the present invention with reference to FIGS. 11(a) to 11(f).

FIGS. 11(a) to 11(f) are sectional views of a main part of a semiconductor device in process steps of the fabrication process according the present invention.

A thick device isolation layer (a field insulating film) 2 made of $SiO_2$ is formed on a surface of a silicon substrate (a wafer) 1 by means of a known selective thermal oxidation method. Thereafter, a silicon oxide film 3 is formed on the silicon substrate 1 by dry oxidation process at 700° C. to a thickness of 1 nm (nano-meter), and then, a silicon nitride film 7 of a thickness of 3 nm is formed on the surface by means of a chemical vapor deposition method using monosilane ($SiH_4$) and ammonia ($NH_3$) as a source gas (FIG. 11(a)). At this point, the silicon nitride film 7 may be formed by means of the chemical vapor deposition using dichlorosilane and ammonia as the source gas. This process has substantially same effect as the foregoing process by the chemical vapor deposition using monosilane and ammonia as the source gas, except with inferiority in thickness control of the silicon nitride film 7.

After formation of the silicon nitride film 7, a photoresist film is applied selectively on the silicon nitride film 7. Actually, first, the resist film 4 is applied across the entire surface of the wafer (FIG. 11(b)), and thereafter, regular photoresist patterning is performed to remove a part of the photoresist film 4 (FIG. 11(c)). A portion that is covered by the photoresist film 4 is called as a region 1, while a portion that is not covered by the photoresist film 4 is called as a region 2, for convenience of description at this time (the regions 1 and 2 are shown beneath FIG. 11(f) with the same terms). Following to the patterning, the silicon nitride film 7 and silicon oxide film 3 in the region 2 is removed by a 0.5% hydrofluoric acid aqueous solution (FIG. 11(d)) and following this, the remaining resist film 4 is removed by ashing (FIG. 11(e)). After the ashing, SC-1 cleaning and SC-2 cleaning are performed to eliminate contaminants on the surface.

Furthermore, second SC-1 cleaning and 0.1% hydrofluoric acid aqueous solution cleaning are performed on the substrate surface and thereafter, pyrogenic oxidation at 800° C. is applied to form a gate insulating film 5 of silicon oxide with a thickness of 6 nm in the region 2. At this time, no change in thickness of the silicon oxide film 3 arises since oxidation does not progress in the region 1 covered by the silicon nitride film 7. By performing the above procedure, in the region 1, formed is a gate insulating film of a stacked structure comprising the silicon nitride film 7 of a thickness of 3 nm and the silicon oxide film 3 of a thickness of 1 nm, while in the region 2, formed is a gate insulating film of the silicon oxide film 5 of a thickness of 6 nm; the gate insulating films are respectively used as gate insulating films of main parts of the respective devices (FIG. 11(f)). Thereafter, gate electrodes are formed on the respective insulating films to complete a semiconductor integrated circuit device comprising MIS FETs as shown in FIG. 2.

Although this embodiment is similar to the foregoing example 1 according the present invention, there are differences in the point where the oxide film conversion thickness of the gate insulating film formed in the region 1 is 2 nm and the oxide film conversion thickness of the gate insulating film formed in the region 2 is 6 nm, and in the point where the thickness level in the region 2 is larger than in the region 1.

Next, description will be given of a fabrication process for a semiconductor device having two kinds of the oxide film conversion thickness 2 nm and 6 nm of the gate insulating films where the present inventors tried to fabricate without applying the present invention, with reference to FIGS. 10(a) to 10(f), in order to facilitate the comparison.

A device isolation layer (a field insulating film) 2 made of $SiO_2$ is formed on a surface of a silicon substrate (a wafer) 1 by means of a known selective thermal oxidation method and thereafter, a silicon oxide film 3 is formed on the silicon substrate 1 at 800° C. to a thickness of 7 nm by means of pyrogenic oxidation in a condition that oxygen and hydrogen are simultaneously supplied at respective flow rates of 10 1/min and 0.5 1/min (FIG. 10(a)). Then, a photoresist film 4 is applied across the entire surface of the wafer (FIG. 10(b)) and thereafter, regular photoresist patterning is performed to remove part of the photoresist film 4 (FIG. 10(c)). A portion that is covered by the photoresist film 4 is called as a region 1, while a portion that is not covered by the photoresist film 4 is called as a region 2 (the regions 1 and 2 are shown beneath FIG. 10(f) with the same terms). Following to the patterning, the silicon oxide film 3 in the region 2 is removed by a 0.5% hydrofluoric acid aqueous solution (FIG. 10(d)) and following this, the remained resist film 4 is removed by ashing (FIG. 10(e)). After the ashing, performed are cleanings with an aqueous solution containing ammonia and hydrogen peroxide water (referred to as SC-1 cleaning) and with an aqueous solution containing hydrochloric acid and hydrogen peroxide water (referred to as SC-2 cleaning) to eliminate contamination of the surface. Furthermore, second SC-1 cleaning and dilute hydrofluoric acid cleaning are performed and thereafter, dry oxidation at 700° C. is applied to form a gate insulating film 5 made of a silicon oxide film with a thickness of 2 nm in the region 2. On the other hand, in the region 1 the silicon oxide film 3 of 7 nm thickness is etched into 5 nm thickness by the cleaning treatments and thereafter by dry oxidation at 700° C. the thickness thereof is again grown to 6 nm so as to form the gate insulating film 6 of the silicon oxide (FIG. 10(f)).

The present embodiment has a large difference comparing the method without applying the present invention, wherein the oxide film conversion thickness of the gate insulating film formed later in the region 2 can be made thicker than that in the region 1.

In, for example, LSI mixedly comprising digital circuits and analog circuits in which the oxide film conversion thickness of the gate insulating films in digital circuit parts are 2 nm and the oxide film conversion thickness of the gate insulating films in analog circuit parts are 6 nm, the analog circuit should be formed at the region 1 according to the process without applying the present invention; on the other hand according to the present embodiment the analog circuit can be formed at the region 2. Namely, according to the present embodiment the gate insulating film can be formed without exposing to photoresist and with a predetermined thickness precisely controlled. Thus, according to the present invention the electron capture level in the film can be reduced and the mutual conductance can be improved by about 7% comparing MISFETs fabricated by means of the process without applying the present invention. Thus transient characteristics are very important for the circuit devices constructing analog circuits.

Embodiment 5

Next, description will be given of a fifth embodiment relating to a fabrication process of the present invention with reference again to FIGS. 7(a) to 7(g).

A device isolation layer 2 is formed on a surface of a silicon substrate (a wafer) 1 by means of a known selective thermal oxidation method, thereafter, a silicon oxide film 3 having a thickness of 1 nm is formed on the silicon substrate 1 by dry oxidation at 700° C. and then, a silicon nitride film 7 having a thickness of 2 nm is formed on the surface by a chemical vapor deposition method using monosilane and ammonia as a source gas (FIG. 7(a)). After formation of the silicon nitride film 7, a photoresist film 4 is applied across the entire wafer surface (FIG. 7(b)), and thereafter, regular photoresist patterning is performed to remove part of the photoresist film 4 (FIG. 7(c)). A portion that is covered by the photoresist film 4 is called as a region 1, while a portion that is not covered by the photoresist film 4 is called as a region 2, for convenience of description at this time. Following to the patterning, the silicon oxide film 3 and silicon nitride film 7 in the region 2 is removed with a 0.5% hydrofluoric acid aqueous solution (FIG. 7(d)) and following this, the remaining resist film 4 is removed by ashing (FIG. 7(e)). After the ashing, SC-1 cleaning and SC-2 cleaning are performed to eliminate contaminants on the surfaces. Furthermore, second SC-1 cleaning and 0.1% hydrofluoric acid aqueous solution cleaning are performed on the substrate surface and then a silicon oxide film 5 having a thickness of 4 nm is formed in the region 2 by pyrogenic oxidation at 700° C. (FIG. 7(f))

In this situation, no change in a thickness of the film in the region 1 arises since oxidation does not progress in the region 1 covered by the silicon nitride film 7. Then, a silicon nitride film 10 having a thickness of 2 nm is deposited thereon by a chemical vapor deposition method using monosilane and ammonia as a source gas. In such a way, in the region 1, formed is a gate insulating film of a stacked structure comprising a silicon nitride film of a thickness of 4 nm and a silicon oxide film of a thickness of 1 nm, while in the region 2, formed is a gate insulating film of a stacked structure comprising a silicon nitride film of a thickness of 2 nm and a silicon oxide film of a thickness of 4 nm (FIG. 7(g)). Thereafter, gate electrodes are formed on the respective insulating films to complete a semiconductor integrated circuit device comprising MIS FETs as described in FIG. 2.

Although this embodiment is similar to the foregoing second embodiment according to the present invention, there are differences in the point where the oxide film conversion thickness of the gate insulating film formed in the region 1 is 3 nm and the oxide film conversion thickness of the gate insulating film formed in the region 2 is 5 nm, thus the thickness level in the region 2 is larger than in the region 1.

In the second embodiment and fifth embodiment the gate insulating films at the regions 1 and 2 are constructed partially by silicon nitride films. The object is to suppress or control boron in the gate electrode diffusing into the silicon substrate by the silicon nitride films in P channel type MISFET. This object can be obtained also by forming the silicon nitride films by the chemical vapor deposition method using dichlorosilane and ammonia as the source gas. Furthermore, as the material effecting the control of boron diffusion except the silicon nitride film, aluminum oxide may be used to obtain the similar effect.

Next, description will be given of a fabrication process for a semiconductor device having two kinds of the oxide film conversion thickness 3 nm and 5 nm of the gate insulating films as same as the fifth embodiment, where the present inventors tried to fabricate without applying the present invention, with reference to FIGS. 12(a) to 12(g), in order to facilitate the comparison.

A device isolation layer (a field insulating film) 2 made of $SiO_2$ is formed on a surface of a silicon substrate (a wafer) 1 by a known selective thermal oxidation method and thereafter, a silicon oxide film 3 having a thickness of 4 nm is formed on the silicon substrate 1 by dry oxidation at 800° C. (FIG. 12(a)) Then, a photoresist film 4 is applied across the entire surface of the wafer (FIG. 12(b)) and thereafter, regular photoresist patterning is performed to remove part of the photoresist film 4 (FIG. 12(c)). A portion that is covered by the photoresist film 4 is called as a region 1, while a portion that is not covered by the photoresist film 4 is called as a region 2 (the regions 1 and 2 are shown beneath FIG. 12(g) with the same terms). Following to the patterning, the silicon oxide film 3 in the region 2 is removed by a 0.5% hydrofluoric acid aqueous solution (FIG. 12(d)) and following this, the remaining resist film 4 is removed by ashing (FIG. 12(e)). After the ashing, performed are cleanings with an aqueous solution containing ammonia and hydrogen peroxide water (referred to as SC-1 cleaning) and with an aqueous solution containing hydrochloric acid and hydrogen peroxide water (referred to as SC-2 cleaning) to eliminate contamination of the surface. Furthermore, second SC-1 cleaning and dilute hydrofluoric acid cleaning are performed and thereafter, dry oxidation at 700° C. is applied to form a silicon oxide film 5 with a thickness of 2 nm in the region 2. In these steps the silicon oxide film 3 of 4 nm thickness in the region 1 is slightly etched into 3 nm thickness by the cleaning treatments and thereafter by the dry oxidation at 700° C. the thickness thereof is again grown to 4 nm so as to form the gate insulating film 6 of the silicon oxide (FIG. 12(f)). Thereafter a silicon nitride film 7 of 2 nm thickness is deposited by a chemical vapor deposition method. Thus, the gate insulating film in the region 1 can be formed with a stacked structure comprising a silicon nitride film of 2 nm thickness and a silicon oxide film of 2 nm thickness, and the gate insulating film in the region 2 can be formed with a stacked structure comprising a silicon nitride film of 2 nm thickness and a silicon oxide film of 4 nm thickness. The oxide film conversion thickness of the former film becomes 3 nm, and that of the later film becomes 5 nm, which has the similar structure as the fifth embodiment according to the present invention.

Figure 13:
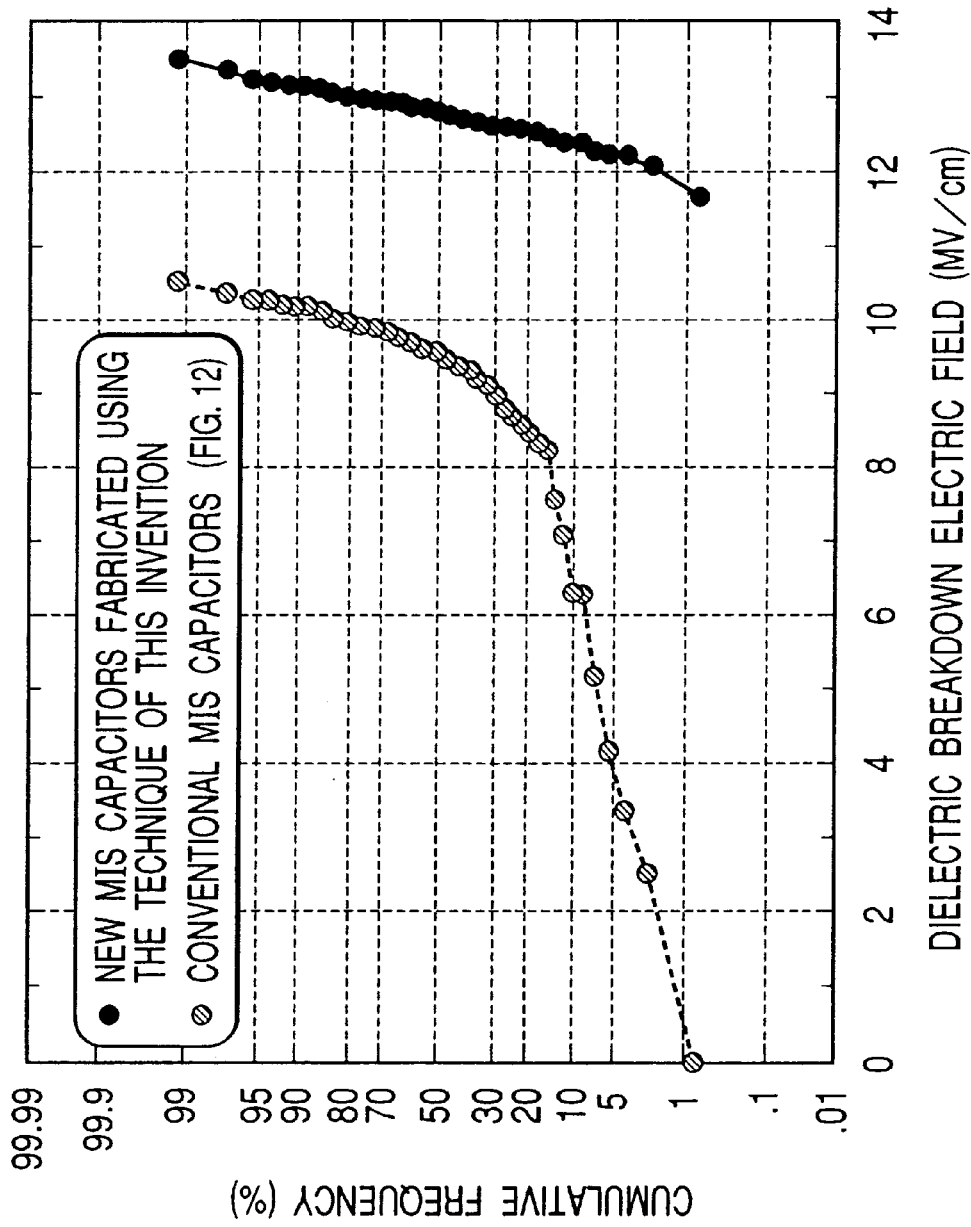
FIG. 13 is a graph of characteristics for explaining the effect of the present invention.

Each of the gate insulating film in the region 1 formed by the method without applying the present invention and the gate insulating film in the region 2 formed by the method of the fifth embodiment according to the present invention are insulating films having stacked structures of a silicon nitride film of 2 nm and a silicon oxide film of 4 nm. In order to study the reliability characteristics of these insulating films, MISFETs are prepared and their dielectric breakdown electric field characteristics are measured as explained in FIG. 8, the results shown in FIG. 13. It is understood that the average value of the dielectric breakdown electric field is improved and the numbers of fault devices having low dielectric breakdown electric field is reduced by applying the present invention. It is also understood that in the method for forming gate insulating films without applying the present invention, on the way of forming a silicon oxide film of 4 nm thickness the reliability characteristic of the gate insulating film goes down due to the cleaning steps after exposing it to photoresist; on the other hand the reliability characteristics can be ensured by the technique according to the present invention. Furthermore, both of those semiconductor devices fabricated by the method as shown in FIGS. 12(a) to 12(g) without applying the present invention and by the method applying the fifth embodiment of the present invention have insulating films in the region 1 and 2 partially constructed with silicon nitride films, but it is an important feature that in the device fabricated by the present invention the silicon nitride films formed in the regions 1 and 2 are different from each other in their film thickness understood from FIG. 7(g).

According to the fabrication process according to the present invention, mass production of semiconductor integrated circuits is realized with high yield since no contamination from photoresist material occurs in a silicon oxide film constructing a gate insulating film, and/or the quantity of defect density in the silicon oxide film to be otherwise caused by aqueous solution treatments is suppressed, and variability of characteristics among many of devices is suppressed.

What is claimed is:

1. A fabrication process for a semiconductor device comprising the steps of:

forming a field insulating layer for device isolation selectively at a surface of a semiconductor substrate made of silicon to form a first and a second semiconductor regions separated from each other by the field insulating layer;

oxidizing the surfaces of the first and second semiconductor regions to form a first and a second silicon oxide films, respectively;

forming a first and a second silicon nitride films respectively on the first and second silicon oxide films by a chemical vapor deposition method using a compound gas including silicon and hydrogen, but substantially without chlorine, and ammonia as a source gas;

applying a photoresist film selectively on the first silicon nitride film;

removing the second silicon nitride film not covered by the photoresist film and the second silicon oxide film therebeneath to expose a surface of the second semiconductor region;

removing the photoresist film remaining on the first silicon nitride film after the exposure of the second semiconductor region;

again oxidizing the exposed surface of the second semiconductor region to form a third silicon oxide film with a thickness different from that of the first silicon oxide film at the surface of the second semiconductor region; and forming a first and a second gate electrodes on the first silicon nitride film and the third silicon oxide film, respectively, to fabricate a first and a second insulated gate devices having gate insulating films with different thickness at the first and second semiconductor regions, respectively.

2. A fabrication process for a semiconductor device according to claim 1, wherein said compound gas substantially without chlorine is monosilane.

3. A fabrication process for a semiconductor device comprising the steps of:

forming a field insulating layer for device isolation selectively at a surface of a semiconductor substrate made of silicon to form a first and a second semiconductor regions separated from each other by the field insulating layer;

oxidizing the surfaces of the first and second semiconductor regions to form a first and a second silicon oxide films, respectively;

forming a first and a second silicon nitride films respectively on the first and second silicon oxide films by a chemical vapor deposition method using a compound gas including silicon and hydrogen, but substantially without chlorine, and ammonia as a source gas;

applying a photoresist film selectively on the first silicon nitride film;

removing the second silicon nitride film not covered by the photoresist film and the second silicon oxide film therebeneath to expose a surface of the second semiconductor region;

removing the photoresist film remaining on the first silicon nitride film after the exposure of the second semiconductor region;

again oxidizing the exposed surface of the second semiconductor region to form a third silicon oxide film with a thickness different from that of the first silicon oxide film at the surface of the second semiconductor region;

forming a third and a fourth silicon nitride films respectively on the first silicon nitride film and the third silicon oxide film by a chemical vapor deposition method using a compound gas including silicon and hydrogen, but substantially without chlorine, and ammonia as a source gas; and forming a first and a second gate electrodes on the third and fourth silicon nitride films, respectively, to fabricate a first and a second insulated gate devices having gate insulating films with different thickness at the first and second semiconductor regions, respectively.

4. A fabrication process for a semiconductor device according to claim 3, wherein said compound gas substantially without chlorine is monosilane.

5. A fabrication process for a semiconductor device comprising the steps of:

forming a field insulating layer for device isolation selectively at a surface of a semiconductor substrate made of silicon to form a first and a second semiconductor regions separated from each other by the field insulating layer;

oxidizing the surfaces of the first and second semiconductor regions to form a first and a second silicon oxide films, respectively;

forming a first and a second silicon nitride films respectively on the first and second silicon oxide films;

applying a photoresist film selectively on the first silicon nitride film;

removing the second silicon nitride film not covered by the photoresist film and the second silicon oxide film therebeneath to expose a surface of the second semiconductor region;

removing the photoresist film remaining on the first silicon nitride film after the exposure of the second semiconductor region;

again oxidizing the exposed surface of the second semiconductor region to form a third silicon oxide film with a thickness larger than the oxide film conversion thickness of the stacked film of the first silicon oxide film and the first silicon nitride film at the surface of the second semiconductor region; and then forming a first and a second gate electrodes on the first silicon nitride film and the third silicon oxide film, respectively, to fabricate a first and a second insulated gate devices having gate insulating films with different oxide film conversion thickness at the first and second semiconductor regions, respectively.

6. A fabrication process for a semiconductor device comprising the steps of:

forming a field insulating layer for device isolation selectively at a surface of a semiconductor substrate made of silicon to form a first and a second semiconductor regions separated from each other by the field insulating layer;

oxidizing the surfaces of the first and second semiconductor regions to form a first and a second silicon oxide films, respectively;

forming a first and a second silicon nitride films respectively on the first and second silicon oxide films;

applying a photoresist film selectively on the first silicon nitride film;

removing the second silicon nitride film not covered by the photoresist film and the second silicon oxide film therebeneath to expose a surface of the second semiconductor region;

removing the photoresist film remaining on the first silicon nitride film after the exposure of the second semiconductor region;

again oxidizing the exposed surface of the second semiconductor region to form a third silicon oxide film with a thickness larger than the oxide film conversion thickness of the stacked film of the first silicon oxide film and the first silicon nitride film at the surface of the second semiconductor region;

forming a third and a fourth silicon nitride films respectively on the first silicon nitride film and the third silicon oxide film; and then forming a first and a second gate electrodes on the third and fourth silicon nitride films, respectively, to fabricate a first and a second insulated gate devices having gate insulating films with different oxide film conversion thickness at the first and second semiconductor regions, respectively.

* * * * *